United States Patent
Wu et al.

(10) Patent No.: US 12,388,422 B2
(45) Date of Patent: Aug. 12, 2025

(54) RESISTIVE ATTENUATOR AND METHOD FOR IMPROVING LINEARITY OF RESISTIVE ATTENUATOR

(71) Applicant: Realtek Semiconductor Corp., HsinChu (TW)

(72) Inventors: Yi-Ching Wu, HsinChu (TW); Chia-Jun Chang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 154 days.

(21) Appl. No.: 18/230,185

(22) Filed: Aug. 4, 2023

(65) Prior Publication Data
US 2024/0178818 A1 May 30, 2024

(30) Foreign Application Priority Data
Nov. 25, 2022 (TW) .................................. 111145234

(51) Int. Cl.
| H03H 11/00 | (2006.01) |
| H03F 1/32 | (2006.01) |
| H03H 7/25 | (2006.01) |
| H03H 11/46 | (2006.01) |

(52) U.S. Cl.
CPC ........... H03H 11/53 (2013.01); H03F 1/3282 (2013.01); H03H 7/25 (2013.01)

(58) Field of Classification Search
CPC ..................................................... H03H 11/53
USPC ......................................................... 327/308
See application file for complete search history.

(56) References Cited

U.S. PATENT DOCUMENTS

| 5,121,075 | A | 6/1992 | Roach | |
|---|---|---|---|---|
| 6,853,248 | B2 | 2/2005 | Weldon | |
| 2007/0194813 | A1* | 8/2007 | Washburn | ............... H03H 11/53 327/100 |
| 2014/0210538 | A1* | 7/2014 | Jordan | ..................... H03H 7/25 327/308 |

* cited by examiner

*Primary Examiner* — Tomi Skibinski
(74) *Attorney, Agent, or Firm* — Winston Hsu

(57) ABSTRACT

A resistive attenuator and a method for improving linearity of the resistive attenuator are provided. The resistive attenuator includes a first transistor, an attenuation circuit and a compensation circuit, wherein both the first transistor and the attenuation circuit are coupled between an input terminal and an output terminal of the resistive attenuator, and the compensation circuit is coupled to the first transistor. The first transistor is configured to provide a first signal path between the input terminal and the output terminal. The attenuation circuit is configured to provide a second signal path between the input terminal and the output terminal, wherein signal attenuation of the second signal path is greater than signal attenuation of the first signal path. The compensation circuit is configured to compensate nonlinear distortion caused by the first transistor.

8 Claims, 3 Drawing Sheets

RESISTIVE ATTENUATOR AND METHOD FOR IMPROVING LINEARITY OF RESISTIVE ATTENUATOR

BACKGROUND OF THE INVENTION

1. Field of the Invention

The present invention is related to attenuator circuits, and more particularly, to a resistive attenuator and a method for improving linearity of the resistive attenuator.

2. Description of the Prior Art

As an external digital pre-distortion circuit typically operates under a condition where a signal power is 0 decibels relative to one milliwatt (dBm), design optimization is performed based on this scenario. In some situations, the external digital pre-distortion circuit needs to handle signals of higher power such as 10 dBm. When the external digital pre-distortion circuit designed based on the 0 dBm signal power condition handles a signal of 10 dBm power, overall linearity may not achieve a target specification: for example, performance related to amplitude-to-amplitude (AMAM) distortion and amplitude-to-phase (AMPM) distortion may fail to meet requirements. The above linearity issues are typically caused by an attenuator within the external digital pre-distortion circuit.

Some related arts solutions add additional loss on signal paths in order to guarantee that the external digital pre-distortion circuit still achieves good linearity while handling the 10 dBm power signal. This solution, however, will mean a corresponding noise figure fails to meet requirements when the external digital pre-distortion circuit handles 0 dBm power signals.

Thus, there is a need for a novel architecture and an associated method, in order to improve linearity of the external digital pre-distortion circuit (and more particularly, the attenuator therein) without introducing any side effect or in a way that is less likely to introduce side effects.

SUMMARY OF THE INVENTION

An objective of the present invention is to provide a resistive attenuator and a method for improving linearity of the resistive attenuator which can make the resistive attenuator able to improve linearity when handling high power signal without affecting performance related to the noise figure or reducing the effect on the noise figure related performance.

At least one embodiment of the present invention provides a resistive attenuator. The resistive attenuator comprises a first transistor, at least one attenuation circuit and a compensation circuit, wherein the first transistor is coupled between an input terminal and an output terminal of the resistive attenuator, the at least one attenuation circuit is coupled between the input terminal and the output terminal, and the compensation circuit is coupled to the first transistor. More particularly, the first transistor is configured to provide a first signal path between the input terminal and the output terminal. The at least one attenuation circuit is configured to provide at least one second signal path between the input terminal and the output terminal, wherein signal attenuation of the at least one second signal path is greater than signal attenuation of the first signal path. In addition, the compensation circuit is configured to compensate nonlinear distortion caused by the first transistor.

At least one embodiment of the present invention provides a method for improving linearity of a resistive attenuator. The method comprises: utilizing a first transistor of the resistive attenuator to provide a first signal path between an input terminal and an output terminal of the resistive attenuator; utilizing at least one attenuation circuit of the resistive attenuator to provide at least one second signal path between the input terminal and the output terminal, wherein signal attenuation of the at least one second signal path is greater than signal attenuation of the first signal path; and utilizing a compensation circuit of the resistive attenuator to compensate nonlinear distortion caused by the first transistor, wherein the compensation circuit is coupled to the first transistor.

The resistive attenuator and the method provided by the embodiment of the present invention utilize configuration of the compensation circuit to cancel nonlinear distortion caused by the transistor coupled between the input terminal and the output terminal in the resistive attenuator. As the compensation circuit will not introduce additional loss, linearity of the resistive attenuator can be improved without sacrificing performance related to the noise figure. In addition, the embodiments of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
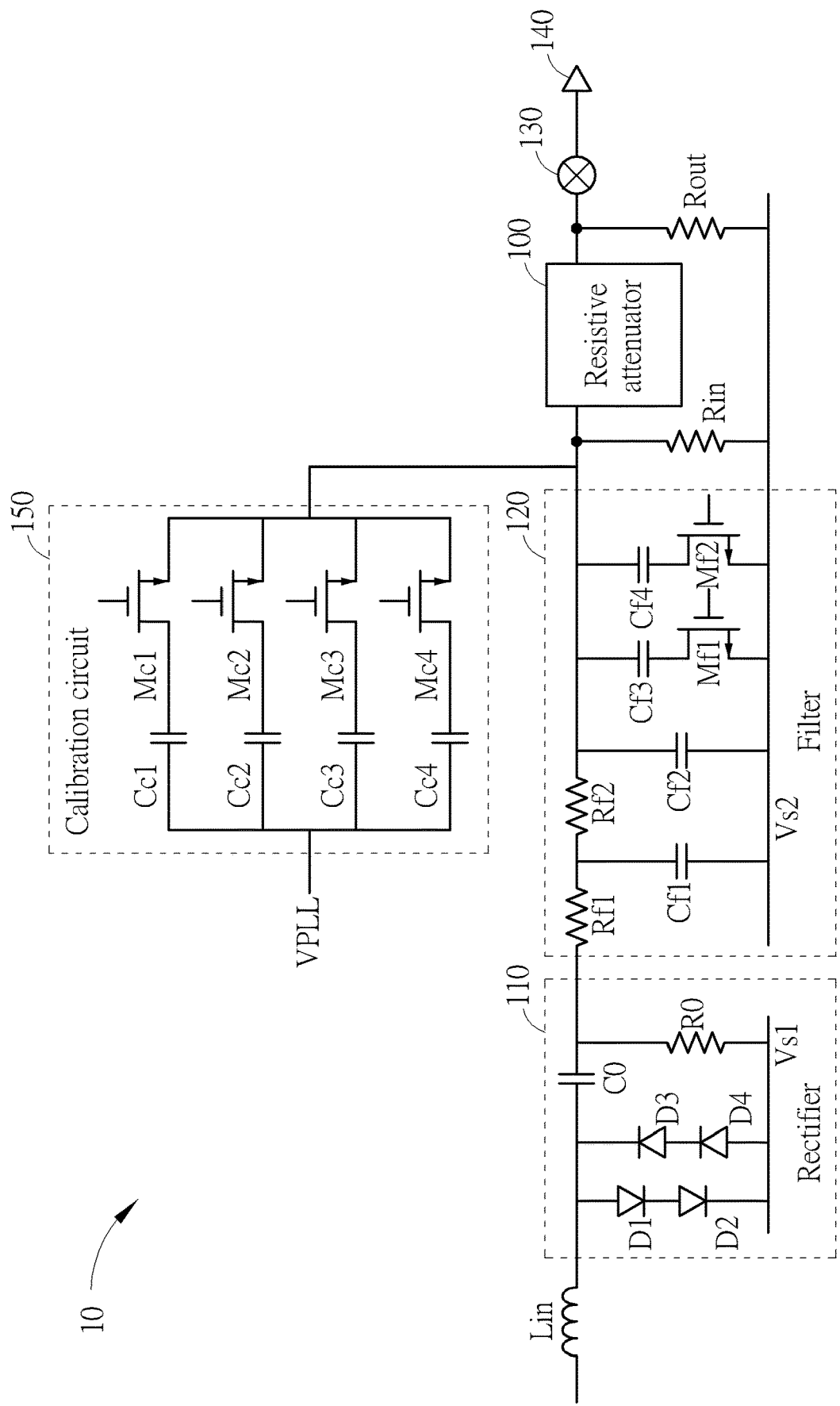
FIG. 1 is a diagram illustrating a digital pre-distortion circuit according to an embodiment of the present invention.

FIG. 1 is a diagram illustrating a digital pre-distortion (DPD) circuit such as an external DPD (EDPD) circuit 10 according to an embodiment of the present invention, where the EDPD circuit 10 at least comprises a resistive attenuator 100. In this embodiment, the EDPD circuit may further comprise an input inductor Lin, a rectifier 110, a filter 120, an input bias resistor Rin, an output bias resistor Rout, a mixer 130, a transimpedance amplifier (TIA) 140 and a calibration circuit 150. More particularly, the EDPD circuit 10 may receive an input signal via the input inductor Lin. After being processed by the rectifier 110 and the filter 120, the resistive attenuator 100 may perform attenuation upon a signal output from the filter 120, to allow the mixer 130 and the TIA 140 generate an output signal according to an attenuated signal output from the resistive attenuator 100. In addition, the calibration circuit 150 may be configured to perform image rejection ratio calibration of the EDPD 10, where the calibration circuit 150 may receive a signal VPLL from a phase locked loop (PLL), and accordingly generate a corresponding test signal for simulating a signal from a signal path of the input inductor Lin, the rectifier 110 and the filter 120.

As shown in FIG. 1, the rectifier 110 may comprise diodes D1, D2, D3 and D4, a capacitor C0 and a resistor R0, where the rectifier 110 operates by taking a voltage level of a reference voltage Vs1 as a reference level. The filter 120 may comprise resistors Rf1 and Rf2, capacitors Cf1, Cf2, Cf3 and Cf4, and transistors Mf1 and Mf2, where the filter 120 operates by taking a voltage level of a reference voltage Vs2 as a reference level, and each of the transistors Mf1 and Mf2 may serve as a switch. The calibration circuit 150 may comprise capacitors Cc1, Cc2, Cc3 and Cc4, and transistors Mc1, Mc2, Mc3 and Mc4, where each of the capacitors Cc1, Cc2, Cc3 and Cc4 may perform alternating current (AC) coupling upon the signal VPLL to extract an AC component within the signal VPLL, and each of the transistors Mc1, Mc2, Mc3 and Mc4 may serve as a switch. It should be noted that the present invention focuses on implementation of the resistive attenuator 100, where the other peripheral components are main points of the present invention, and detailed operations of these peripheral components are omitted here for brevity. In addition, the above implementation details are examples of these peripheral components, but the present invention is not limited thereto.

Figure 2:
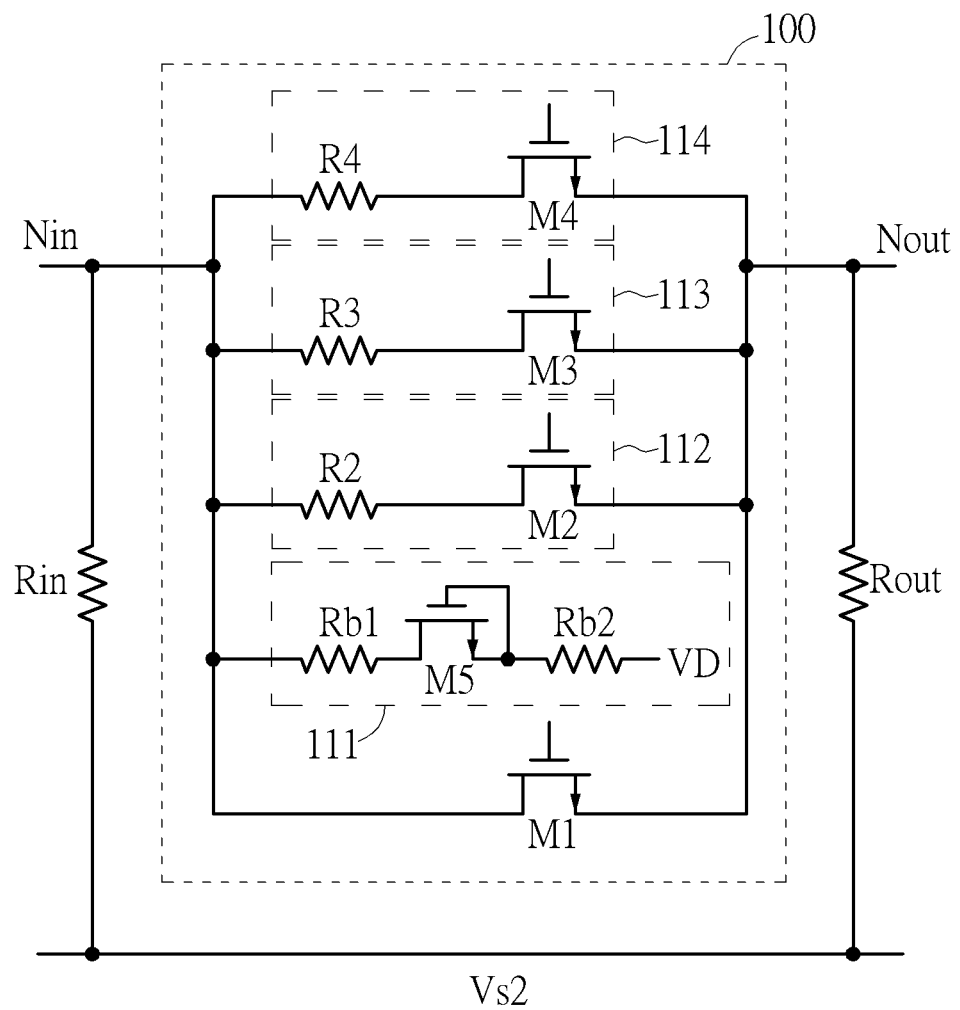
FIG. 2 is a diagram illustrating details of the digital pre-distortion circuit shown in FIG. 1 according to an embodiment of the present invention.

FIG. 2 is a diagram illustrating details of the digital pre-distortion circuit shown in FIG. 1 according to an embodiment of the present invention. As shown in FIG. 2, the resistive attenuator 100 may comprise a transistor M1, at least one attenuation circuit such as attenuation circuits 112, 113 and 114, and a compensation circuit 111, where the transistor M1 is coupled to an input terminal Nin and an output terminal Nout of the resistive attenuator 100, each of the attenuation circuits 112, 113 and 114 are coupled between the input terminal Nin and the output terminal Nout, and the compensation circuit 111 is coupled to the transistor M1 (e.g. coupled between a reference voltage VD and the input terminal Nin). In this embodiment, the transistor M1 may be configured to provide a first signal path between the input terminal Nin and the output terminal Nout. Each of the attenuation circuits 112, 113 and 114 may be configured to provide at least one second signal path between the input terminal Nin and the output terminal Nout, where signal attenuation of the at least one second signal path is greater than signal attenuation of the first signal path. For better illustration, the first signal path may be referred to as a low loss path, and the at least one second signal path may be referred to as a high loss path. In addition, the compensation circuit 111 may be configured to compensate nonlinear distortion caused by the transistor M1.

In this embodiment, each of the attenuation circuits 112, 113 and 114 may comprise an attenuation resistor and a switch transistor, and the switch transistor and the attenuation resistor are connected in series between the input terminal Nin and the output terminal Nout. In detail, the attenuation circuit 112 may comprise an attenuation resistor R2 and a switch transistor M2, and the switch transistor M2 and the attenuation resistor R2 are connected in series between the input terminal Nin and the output terminal Nout. The attenuation circuit 113 may comprise an attenuation resistor R3 and a switch transistor M3, and the switch transistor M3 and the attenuation resistor R3 are connected in series between the input terminal Nin and the output terminal Nout. The attenuation circuit 114 may comprise an attenuation resistor R4 and a switch transistor M4, and the switch transistor M4 and the attenuation resistor R4 are connected in series between the input terminal Nin and the output terminal Nout. In addition, a gate terminal of the transistor M1 is configured to control whether to enable the low loss path provided by the transistor M1, a gate terminal of the transistor M2 is configured to control whether to enable the high loss path provided by the attenuation circuit 112, a gate terminal of the transistor M3 is configured to control whether to enable the high loss path provided by the attenuation circuit 113, and a gate terminal of the transistor M4 is configured to control whether to enable the high loss path provided by the attenuation circuit 114.

In this embodiment, overall signal attenuation between the input terminal Nin and the output terminal Nout may be determined according to whether any of the first signal path and the second signal path is enabled. For example, when all of the transistors M1, M2, M3 and M4 are turned on, the resistive attenuator 100 may provide a first attenuation rate between the input terminal Nin and the output terminal Nout. When the transistor M1 is turned off and the transistors M2, M3 and M4 are turned on, the resistive attenuator 100 may provide a second attenuation rate between the input terminal Nin and the output terminal Nout. When the transistors M1 and M2 are turned off and the transistors M3 and M4 are turned on, the resistive attenuator 100 may provide a third attenuation rate between the input terminal Nin and the output terminal Nout. When the transistors M1, M2 and M3 are turned off and the transistor M4 is turned on, the resistive attenuator 100 may provide a fourth attenuation rate between the input terminal Nin and the output terminal Nout.

As the low loss path provided by the transistor M1 does not have a transistor connected in series with the transistor M1, however, when the transistor M1 is turned on, a signal on the input terminal Nin may have a high power transmitted to the output terminal Nout through the transistor M1, making a signal conversion between the input terminal Nin and the output terminal Nout have a lot of nonlinear components (e.g. a third order term). In order to prevent linearity of the resistive attenuator 100 from getting worse due to the transistor M1, the present invention utilizes the compensation circuit 11 to generate a reverse third order term to cancel the third order term generated by the transistor M1 for compensating the nonlinear distortion caused by the transistor M1.

As shown in FIG. 2, the compensation circuit 111 may comprise the transistor M5, where a gate terminal of the transistor M5 is coupled to a source terminal of the transistor M5. In addition, the compensation circuit 111 may further comprise bias resistors Rb1 and Rb2, where the bias resistor Rb1 is coupled between the transistors M5 (e.g. coupled to a drain terminal of the transistor M5) and the transistor M1, and the bias resistor Rb2 is coupled between the transistor M5 (e.g. coupled to the source terminal of the transistor M5) and the reference voltage VD. In particular, the bias resistors Rb1 and Rb2 may be configured to control a drain-to-source voltage difference of the transistor M5, to make nonlinear distortion caused by the transistor M5 and the nonlinear distortion caused by the transistor M1 be canceled by each other. In some embodiments, the transistors M5 and M1 may have the same size (e.g. channel width and channel length). In other embodiments, the transistors M5 and M1 may have different sizes. In some embodiments, the bias resistors Rb1 and Rb2 may have the same resistance. In other embodiments, the bias resistors Rb1 and Rb2 may have different resistances. As long as the transistor M5 under bias control of the bias resistors Rb1 and Rb2 generates a third order term having the same (or similar) magnitude and opposite direction as the transistor M1, designs of the size of the transistor M5 and the resistances of the bias resistors Rb1 and Rb2 may vary.

TABLE 1

| Config-uration | AMAM (Enable compensation circuit) | AMAM (Disable compensation circuit) | AMPM (Enable compensation circuit) | AMPM (Disable compensation circuit) |
|---|---|---|---|---|
| #1 | −0.279 | −0.432 | −0.932 | −1.07 |
| #2 | −0.151 | −0.252 | −0.636 | −0.882 |
| #3 | −0.063 | −0.116 | −0.364 | −0.538 |
| #4 | −0.013 | −0.024 | −0.183 | −0.232 |

Table 1 shows amplitude-to-amplitude (AMAM) distortion and amplitude-to-phase (AMPM) distortion for illustrating linearity improvements obtained from the compensation circuit 111 of the present invention. The second column to the fifth column of Table 1 represent, respectively, AMAM distortion (with values in decibels) of the resistive attenuator 100 under a condition where the compensation circuit 111 is enabled, AMAM distortion (with values in decibels) of the resistive attenuator 100 under a condition where the compensation circuit 111 is disabled, AMPM distortion (with values in degrees) of the resistive attenuator 100 under the condition where the compensation circuit 111 is enabled, and AMPM distortion (with values in degrees) of the resistive attenuator 100 under the condition where the compensation circuit 111 is disabled. The second row to the fifth row of Table 1 represent, respectively, the resistive attenuator 100 configured to have the first attenuation rate, the second attenuation rate, the third attenuation rate and the fourth attenuation rate. For example, configuration #1 shown in Table 1 represents that all of the transistors M1, M2, M3 and M4 are turned on, configuration #2 shown in Table 1 represents that the transistor M1 is turned off and the transistors M2, M3 and M4 are turned on, configuration #3 shown in Table 1 represents that the transistors M1 and M2 are turned off and the transistors M3 and M4 are turned on, and configuration #4 shown in Table 1 represents that the transistors M1, M2 and M3 are turned off and the transistor M4 is turned on. As shown in Table 1, in comparison with the condition of turning off the compensation circuit 111, the AMAM distortion and the AMPM distortion of the resistive attenuator 100 can be effectively reduced when the compensation circuit 111 is enabled, where lower absolute values of the AMAM distortion and the AMPM distortion shown in Table 1 means better linearity. It should be noted that there are still some parasitic capacitors (e.g. gate-to-source capacitors or gate-to-drain capacitors) under a condition where the transistor M1 is turned off, making the transistor M1 (which is turned off) continue to generate nonlinear terms which impact the linearity of the resistive attenuator 100. Thus, even though the transistor M1 is turned off when the resistive attenuator 100 is configured to have any of the second attenuation rate, the third attenuation rate, and the fourth attenuation rate, the linearity of the resistive attenuator 100 still can be improved because of using the compensation circuit 111.

In addition the resistive attenuator 100 can obtain improvements in performance related to third-order-intermodulation distortion (IMD3) by using the compensation circuit 111. In particular, regardless of testing with an input signal of 10 decibels relative to one milliwatt (dBm) or 5 dBm, IMDs results can be improved when the resistive attenuator 100 is configured to have any of the first attenuation rate, the second attenuation rate, the third attenuation rate and the fourth attenuation rate because of using the compensation circuit 111, and more particularly, results of both upper band IMD3 and lower band IMD3 can be improved.

Figure 3:
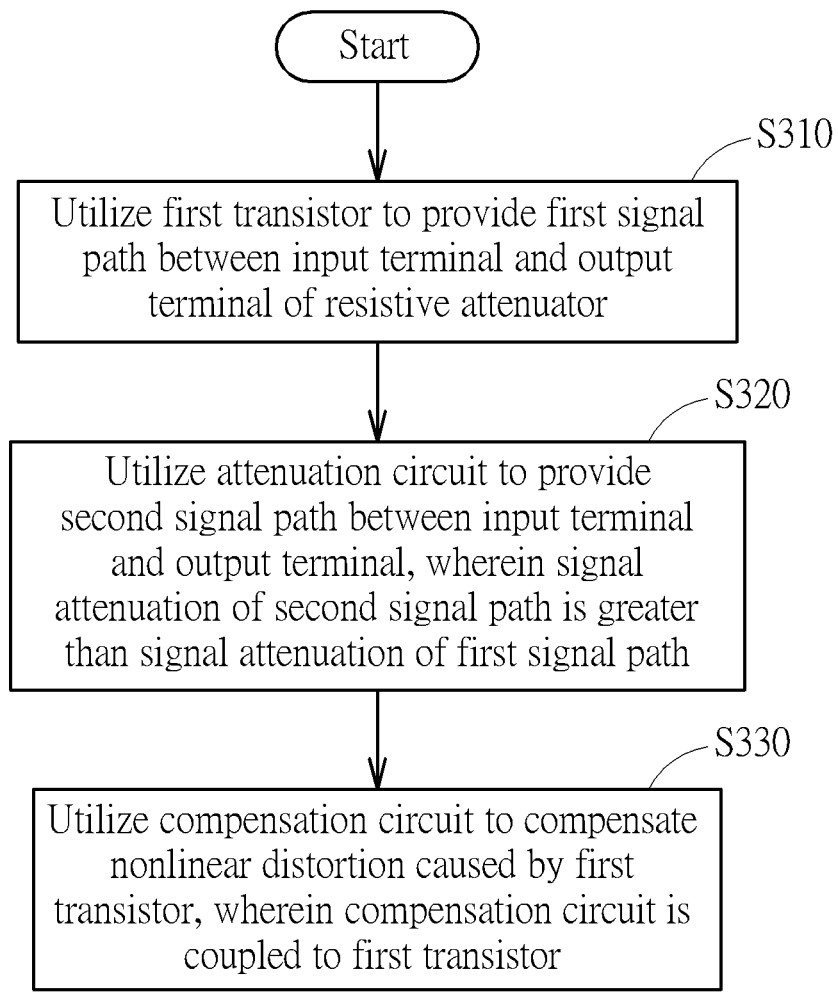
FIG. 3 is a diagram illustrating a working flow of a method for performing linearity of a resistive attenuator according to an embodiment of the present invention.

FIG. 3 is a diagram illustrating a working flow of a method for performing linearity of a resistive attenuator (e.g. the resistive attenuator 100 shown in FIG. 2) according to an embodiment of the present invention. It should be noted that the working flow shown in FIG. 3 is for illustrative purposes only, and is not meant to be a limitation of the present invention. More particularly, if a same result can be obtained, one or more steps may be added, deleted or modified in the working flow shown in FIG. 3. In addition, these steps do not have to be executed in the exact order shown in FIG. 3.

In Step S310, the resistive attenuator may utilize a first transistor therein to provide a first signal path between an input terminal and an output terminal of the resistive attenuator.

In Step S320, the resistive attenuator may utilize at least one attenuation circuit therein to provide at least one second signal path between the input terminal and the output terminal, wherein signal attenuation of the at least one second signal path is greater than signal attenuation of the first signal path.

In Step S330, the resistive attenuator may utilize a compensation circuit therein to compensate nonlinear distortion caused by the first transistor, wherein the compensation circuit is coupled to the first transistor.

To summarize, the embodiments of the present invention can make a nonlinear term generated by the transistor M5 and a nonlinear term generated by the transistor M1 cancel each other by controlling bias of the transistor M5 within the compensation circuit 111. Thus, the embodiments of the present invention can reduce nonlinear distortion caused by the transistor M1 as much as possible without connecting additional resistor(s) in series with the transistor M1. In addition, the embodiments of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive attenuator, comprising:
a first transistor, coupled between an input terminal and an output terminal of the resistive attenuator, configured to provide a first signal path between the input terminal and the output terminal;
at least one attenuation circuit, coupled between the input terminal and the output terminal, configured to provide at least one second signal path between the input terminal and the output terminal, wherein signal attenuation of the at least one second signal path is greater than signal attenuation of the first signal path; and
a compensation circuit, coupled to the first transistor, configured to compensate nonlinear distortion caused by the first transistor;
wherein the compensation circuit comprises a second transistor, and a gate terminal of the second transistor is coupled to a source terminal of the second transistor.

2. The resistive attenuator of claim 1, wherein the compensation circuit further comprises:
  a first bias resistor, coupled between the first transistor and the second transistor; and
  a second bias resistor, coupled between the second transistor and a reference voltage;
  wherein the first bias resistor and the second bias resistor are configured to control a drain-to-source voltage difference of the second transistor, to make nonlinear distortion caused by the second transistor cancel and the nonlinear distortion caused by the first transistor cancel each other.

3. The resistive attenuator of claim 1, wherein the at least one attenuation circuit comprises an attenuation resistor and a switch transistor, and the switch transistor and the attenuation resistor are connected in series between the input terminal and the output terminal.

4. The resistive attenuator of claim 3, wherein a gate terminal of the first transistor is configured to control whether to enable the first signal path, a gate terminal of the switch transistor is configured to control whether to enable the at least one second signal path, and overall signal attenuation between the input terminal and the output terminal is determined according to whether any of the first signal path and the at least one second signal path is enabled.

5. A method for improving linearity of a resistive attenuator, comprising:
  utilizing a first transistor of the resistive attenuator to provide a first signal path between an input terminal and an output terminal of the resistive attenuator;
  utilizing at least one attenuation circuit of the resistive attenuator to provide at least one second signal path between the input terminal and the output terminal, wherein signal attenuation of the at least one second signal path is greater than signal attenuation of the first signal path; and
  utilizing a compensation circuit of the resistive attenuator to compensate nonlinear distortion caused by the first transistor, wherein the compensation circuit is coupled to the first transistor;
  wherein the compensation circuit comprises a second transistor, and a gate terminal of the second transistor is coupled to a source terminal of the second transistor.

6. The method of claim 5, wherein the compensation circuit further comprises a first bias resistor and a second bias resistor, the first bias resistor is coupled between the first transistor and the second transistor, the second bias resistor is coupled between the second transistor and a reference voltage, and utilizing the compensation circuit of the resistive attenuator to compensate the nonlinear distortion caused by the first transistor comprises:
  utilizing the first bias resistor and the second bias resistor to control a drain-to-source voltage difference of the second transistor, to make nonlinear distortion caused by the second transistor cancel and the nonlinear distortion caused by the first transistor cancel each other.

7. The method of claim 5, wherein the at least one attenuation circuit comprises an attenuation resistor and a switch transistor, and the switch transistor and the attenuation resistor are connected in series between the input terminal and the output terminal.

8. The method of claim 7, further comprising:
  utilizing a gate terminal of the first transistor to control whether to enable the first signal path; and
  utilizing a gate terminal of the switch transistor to control whether to enable the at least one second signal path;
  wherein overall signal attenuation between the input terminal and the output terminal is determined according to whether any of the first signal path and the at least one second signal path is enabled.

* * * * *